United States Patent [19]
Koshikawa

[11] Patent Number: 5,517,458
[45] Date of Patent: May 14, 1996

[54] ROLL CALL DECODER FOR SEMICONDUCTOR MEMORY HAVING REDUNDANT MEMORY CELLS

[75] Inventor: Yasuji Koshikawa, Tokyo, Japan

[73] Assignee: NEC Corporation, Tokyo, Japan

[21] Appl. No.: 296,468

[22] Filed: Aug. 26, 1994

[30] Foreign Application Priority Data

Aug. 26, 1993 [JP] Japan ..................... 5-211319

[51] Int. Cl.$^6$ ..................................... G11C 8/00
[52] U.S. Cl. .............. 365/230.06; 365/201; 365/200; 365/190; 371/21.1
[58] Field of Search ................... 365/201, 200, 365/190, 230.06; 371/21.1, 29.1

[56] References Cited

U.S. PATENT DOCUMENTS

| | | | |
|---|---|---|---|
| 4,635,190 | 1/1987 | Meyer et al. ............... | 365/200 |
| 4,984,205 | 1/1991 | Sugibayashi ............... | 365/200 |
| 5,124,949 | 6/1992 | Morigami .................. | 365/210 |
| 5,343,429 | 8/1994 | Nakayama et al. ......... | 365/200 |

*Primary Examiner*—David C. Nelms
*Assistant Examiner*—Andrew Q. Tran
*Attorney, Agent, or Firm*—Foley & Lardner

[57] ABSTRACT

A roll call circuit for a semiconductor memory having a plurality of redundant memory cells, comprises a circuit for cutting off a path for transferring a memory cell information to an output pad at the time of a roll call test, and another circuit for transferring the result of the roll call test to the path so that the result of the roll call test is outputted from the output pad at the time of the roll call test.

6 Claims, 5 Drawing Sheets

ROLL CALL DECODER FOR SEMICONDUCTOR MEMORY HAVING REDUNDANT MEMORY CELLS

BACKGROUND OF THE INVENTION

1. Field of the invention

The present invention relates to a roll call circuit, and more specifically to a roll call reading circuit for a semiconductor memory having a plurality of redundant word lines or a plurality of redundant column lines.

2. Description of related art

Recent semiconductor memories are inclined to have a large storage capacity, and therefore, have an increased number of word lines and column lines. With this inclination, the recent semiconductor memories have redundant word lines and redundant column lines for lowering defective operation. Therefore, most of the semiconductor memories are provided with a roll call circuit for discriminating use or non-use of each redundant memory line (such as redundant word lines and redundant column lines) at the time of evaluating a product and of analyzing a defective product.

Figure 1:
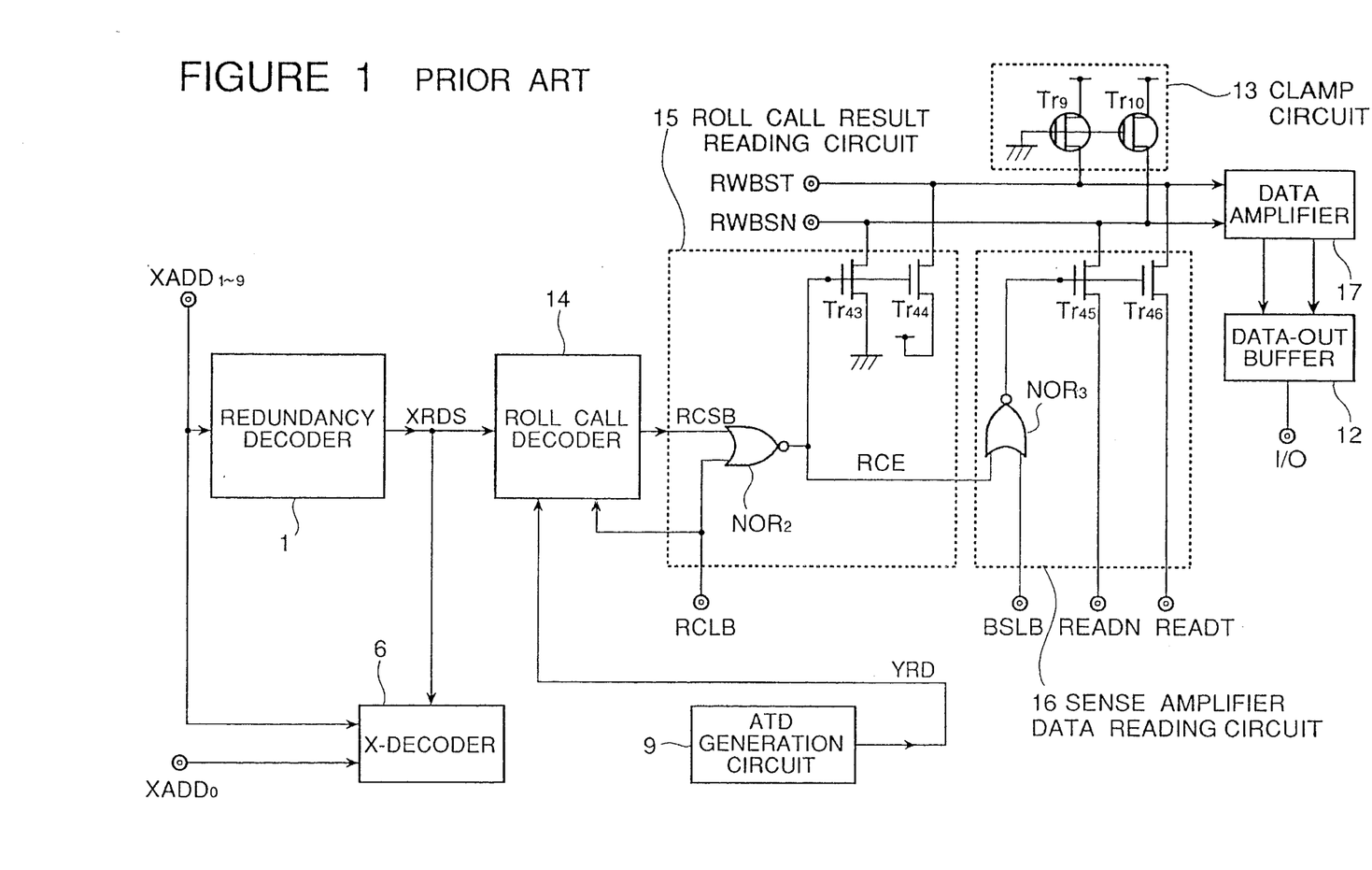
FIG. 1 is a circuit diagram of one example of the conventional roll call circuit.

Referring to FIG. 1, there is shown a circuit diagram of one example of the conventional roll call circuit. The shown conventional roll call circuit includes a data-out buffer 12 for outputting data on an input/output pad I/O, a data amplifier 17 for amplifying data on a pair of complementary lines RWBST and RWBSN of an internal read/write bus so as to supply the amplified data to the data-out buffer 12, a sense amplifier data reading circuit 16 receiving a memory cell data from a sense amplifier (not shown in FIG. 1) to supply the received memory cell data to the pair of complementary lines RWBST and RWBSN, and a roll call result reading circuit 15 for supplying a roll call discrimination result to the pair of complementary lines RWBST and RWBSN.

Furthermore, the shown conventional roll call circuit includes a redundancy decoder 1 receiving internal address signals $XADD_1$ to $XADD_9$ which correspond to an X address supplied to external address input pins $A_1$ to $A_9$ (not shown), respectively. For example, if the X address supplied to the address input pin $A_1$ is "1", the signal $XADD_1$ is brought to a logical high level, or if the X address supplied to the address input pin $A_1$ is "0" (zero), the signal $XADD_1$ is brought to a logical low level. Similarly, the signals $XADD_2$ to $XADD_9$ are brought to the logical high level or the logical low level in accordance with the value of the X address supplied to the address input pins $A_2$ to $A_9$, respectively. This redundancy decoder 1 determines whether or not a redundancy word line should be selected.

The shown conventional roll call circuit also includes an X decoder 6 receiving the signals $XADD_1$ to $XADD_9$, an internal address signal $XADD_0$ brought to the logical high level or the logical low level in accordance with the value of the X address supplied to an external address input pins $A_0$ (not shown), and an output XRDS of the redundancy decoder 1. The X decoder 6 determines on the basis of its inputs $XADD_0$, $XADD_1$ to $XADD_9$, which of words lines should be selected.

The shown conventional roll call circuit further includes a roll call decoder 14 receiving the output XRDS of the redundancy decoder 1, a one-shot precharge signal YRD generated by an ATE) generation circuit 9, and a signal RCLB. The one-shot precharge signal YRD generated by the ATD generation circuit 9 is used for precharging a dynamic circuit (not shown in FIG. 1) incorporated in the roll call decoder 14. At the time of a roll call testing, the roll call decoder 14 generates an output RCSB on the basis of the result of the roll call testing.

The sense amplifier data reading circuit 16 includes a pair of transfer gates composed of N-channel transistors $Tr_{46}$ and $Tr_{45}$, respectively, which are respectively connected between the pair of complementary lines RWBST and RWBSN and a pair of complementary data lines READT and READN from the sense amplifier, and a NOR gate $NOR_3$ for outputting a control signal to a gate of each of the transfer gate transistors $Tr_{45}$ and $Tr_{46}$. The NOR gate $NOR_3$ has one input connected to receive an input signal BSLB and the other input connected to receive an output RCE of the roll call result reading circuit 15.

The roll call result reading circuit 15 includes a NOR gate $NOR_2$ having one input connected to an output RCSB of the roll call decoder 14 and the other input connected to receive the signal RCLB, a transfer gate N-channel transistor $Tr_{43}$ connected between the line RWBSN and ground and having a gate connected to an output of the NOR gate $NOR_2$, and another transfer gate N-channel transistor $Tr_{44}$ connected between a voltage supply line and the line RWBST and having a gate connected to the output of the NOR gate $NOR_2$.

The pair of complementary lines RWBST and RWBSN are clamped to a voltage supply voltage by means of a clamp circuit 13 formed of a pair of a gate-grounded P-channel transistors $Tr_9$ and $Tr_{10}$ connected between the voltage supply line and the pair of complementary lines RWBST and RWBSN, respectively.

Now, operation will be described.

First, an operation for reading a memory cell data is as follows: The signal RCLB is a test mode activation signal which is brought to the logical low level only when the roll call test is carried out. Therefore, at the time of reading the memory cell data, since signal RCLB is at the logical high level, the signal. RCE is at the logical low level. Accordingly, during a low period of the input signal BSLB, the N-channel transistors $Tr_{45}$ and $Tr_{46}$ are ON, so that the sense amplifier data READT and READN are transferred to the lines RWBST and RWBSN, respectively, and therefore, amplified by the data amplifier 17 so as to outputted through the data-out buffer 12 to the input/output pad I/O. In this condition, since the signal RCE is at the logical low level, the N-channel transistors $Tr_{43}$ and $Tr_{44}$ are OFF, and therefore, no data is sent from the roll call result reading circuit 15 to the lines RWBST and RWBSN.

The following is operation of the roll call testing.

At the time of the roll call testing, the signal RCLB is brought to the logical low level. Therefore, the data on the lines RWBST and RWBSN is determined by the level of the output signal RCSB of the roll call result reading circuit 14. If the output signal RCSB is at the logical low level, the signal RCE is brought to the logical high level, so that the N-channel transistors $Tr_{43}$ and $Tr_{44}$ are ON and the N-channel transistors $Tr_{45}$ and $Tr_{46}$ are OFF. Accordingly, the line RWBST is brought to the 25 logical high level, and the line RWBSN is brought to the logical low level. This data is amplified by the data amplifier 17 and outputted through the data-out buffer 12 to the input/output pad I/O.

If the output signal RCSB is at the logical high level, the N-channel transistors $Tr_{43}$ and $Tr_{44}$ are OFF and the N-channel transistors $Tr_{45}$ and $Tr_{46}$ are rendered ON during the logical low level period of the input signal BSLB. Accordingly, the sense amplifier data is transferred to the lines RWBST and RWBSN, and amplified by the data amplifier 17 so as to outputted through the data-out buffer 12 to the input/output pad I/O.

As mentioned above, at the time of a roll call testing, the roll call decoder 14 generates an output RCSB on the basis of the result of the roll call testing. Therefore, if the memory cell is previously written to the effect that the sense amplifier data READT is at the logical high level and the sense amplifier data READN is at the logical low level, the data outputted on the input/output pad I/O changes dependently upon whether the signal RCSB is at the logical high level or at the logical low level.

Thus, if the roll call testing is carried out while changing the combination of the high level and the low level in the signals $XADD_1$ to $XADD_9$, it is possible to discriminate, from the signal appearing on the input/output terminal I/O, use or non-use of the redundancy word line in accordance with the condition of $XADD_1$ to $XADD_9$.

Figure 2:
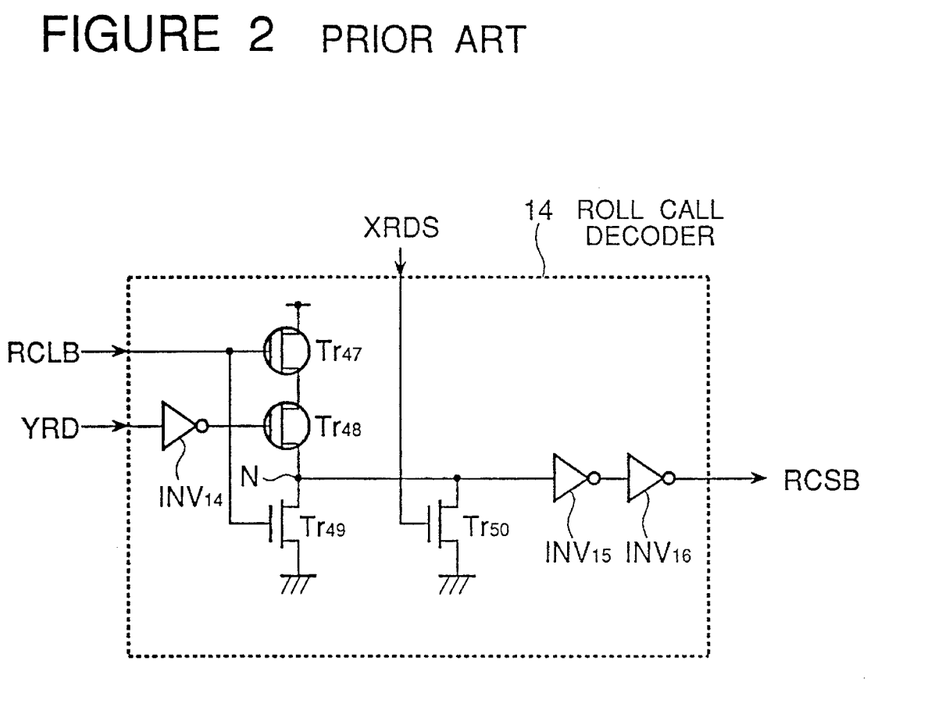
FIG. 2 is a circuit diagram of the roll call decoder included in the conventional roll call circuit shown in FIG. 1.

Referring to FIG. 2, there is shown a circuit of the roll call decoder 14 included in the conventional roll call circuit shown in FIG. 1. The shown roll call decoder 14 includes an inverter $INV_{14}$ receiving the one-shot precharge signal YRD, a P-channel transistor $Tr_{48}$ having a gate connected to an output of the inverter INV 14, and another P-channel transistor $Tr_{47}$ having a gate connected to receive the input signal RCLB. These transistors $Tr_{47}$ and $Tr_{48}$ are connected in series between the voltage supply line and a precharge node "N". The input signal RCLB is also applied to a gate of an N-channel transistor $Tr_{49}$, which is connected between the precharge node "N" and ground. Another N-channel transistor $Tr_{50}$, which has a gate connected to receive the output signal XRDS, is also connected between the precharge node "N" and ground. The precharge node "N" is connected to a cascaded inverters $INV_{15}$ and $INV_{16}$, which operate to buffer a level on the precharge node "N" so as to generate the output RCSB.

Now, operation of the roll call decoder 14 will be described.

At the time of the roll call testing, since the input RCLB is the logical low level, the precharge node "N" is precharged to the voltage supply Voltage level during the logical high level period of the one-shot precharge signal YRD. If tile input signal XRDS is at the high level, a level on the precharge node "N" is determined by a resistance division ratio of the transistors $Tr_{47}$, $Tr_{48}$ and $Tr_{50}$. The inverter $INV_{15}$ is set or configured to have such a threshold that the inverter $INV_{16}$ outputs a logical high level as the output RSCB at this time.

At a time other than the roll call testing, the input RCLB is at the logical high level, and therefore, the transistor $Tr_{49}$ is ON so that the precharge node "N" is fixed to a ground level.

Here, if the redundancy word line is used, the XRDS is at the logical high level, and if the redundancy word line is not used, the XRDS is at the logical low level. Therefore, the roll call can be realized.

In the above mentioned roll call circuit, since the sense amplifier data is read out when the roll call decoder output RCSB is at the logical high level, if there is a failure in the sense amplifier, the memory cell and a write circuit, there is possibility that the data outputted onto the input/output pad is inverted.

Furthermore, since one roll call decoder and one roll call result reading circuit are required for each one redundancy word line, in the case that a plurality of redundancy word lines are provided, a required circuit area and the required number of signal lines are increased. To an extreme, there is possibility that the output line pairs RWBST and RWBSN, the data amplifiers, the data-out buffers and the input/output buffers become shorted.

SUMMARY OF THE INVENTION

Accordingly, it is an object of the present invention to provide a roll call circuit for a semiconductor memory, which has overcome the above mentioned defect of the conventional one.

Another object of the present invention is to provide a roll call circuit for a semiconductor memory having a plurality of redundant word or column lines, which roll call circuit can perform the roll call test even if the semiconductor memory is a defective product having a defect in a memory cell.

Still another object of the present invention is to provide a roll call circuit for a semiconductor memory having a plurality of redundant word or column lines, which roll call circuit can test use or non-use of the plurality of redundant word or column lines by use of one roll call decoder.

The above and other objects of the present invention are achieved in accordance with the present invention by a roll call circuit for a semiconductor memory having a plurality of redundant memory cells, the roll call circuit comprising a circuit for cutting off a path for transferring a memory cell information to an output pad at the time of a roll call test, and another circuit for transferring the result of the roll call test to the path so that the result of the roll call test is outputted from the output pad at the me of the roll call test.

The above and other objects, features and advantages of the present invention will be apparent from the following description of preferred embodiments of the invention with reference to the accompanying drawings.

DESCRIPTION OF THE PREFERRED EMBODIMENTS

Figure 3:
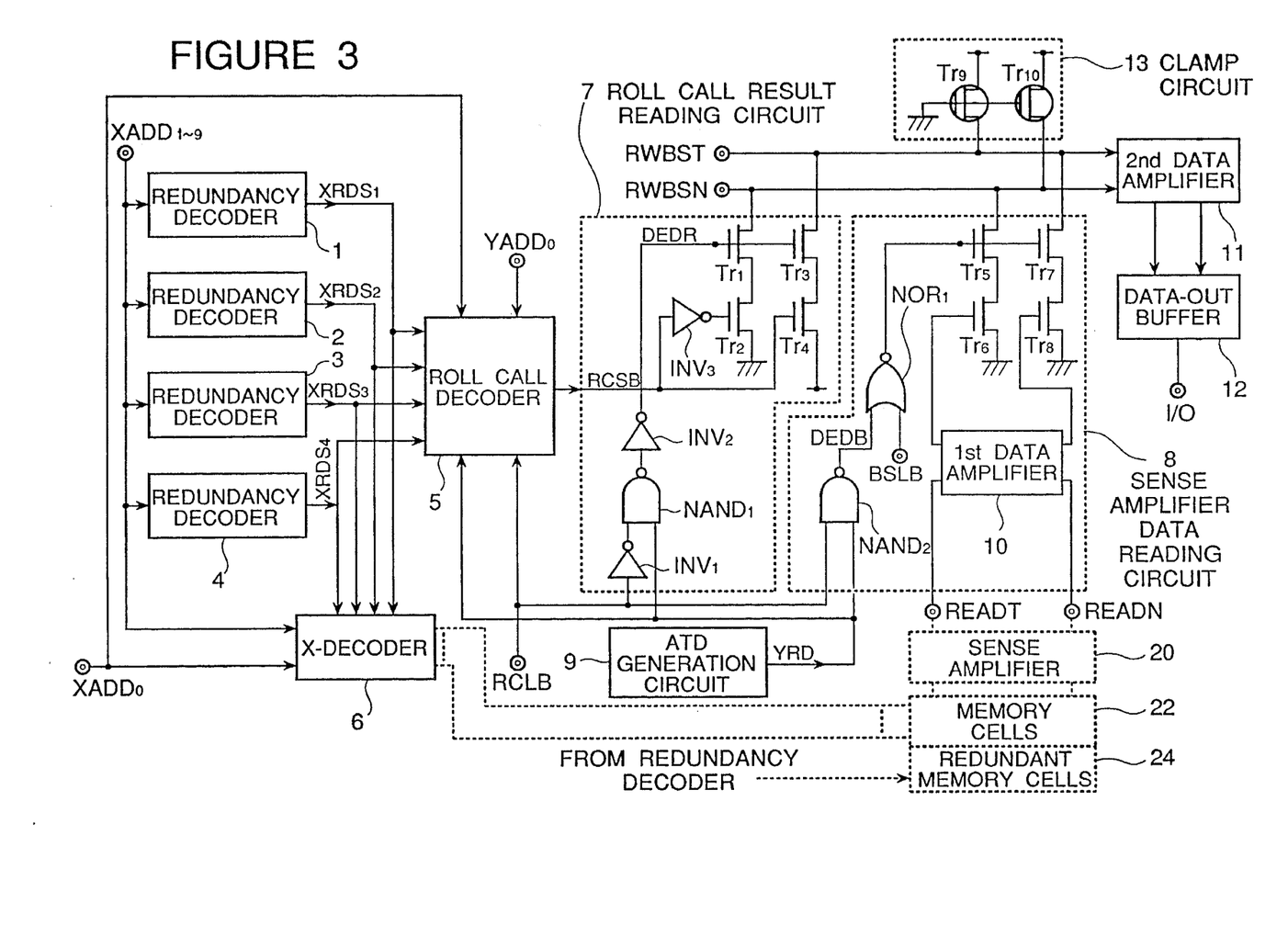
FIG. 3 is a circuit diagram of one embodiment of the roll call circuit in accordance with the present invention.

Referring to FIG. 3, there is shown a circuit diagram of one embodiment of the roll call circuit in accordance with the present invention. In FIG. 3, elements similar or corresponding to those shown in FIG. 1 are given the same Reference Numerals or Signs.

The shown embodiment includes a data-out buffer 12 for outputting data onto an input/output pad I/O, a data amplifier 11 for amplifying data on a pair of complementary lines RWBST and RWBSN of an internal read/write bus so as to supply the amplified data to the data-out buffer 12, a sense amplifier dam reading circuit 8 receiving a memory cell data from a sense amplifier 20 to supply the received memory cell data to the pair of complementary lines RWBST and RWBSN, and a roll call result reading circuit 7 for supplying a roll call discrimination result to the pair of complementary lines RWBST and RWBSN. The sense amplifier 20 is coupled to a memory cell matrix including a number of memory cells 22 and a plurality of redundant memory cells 24, which are arranged in the form of a matrix having a plurality of rows and a plurality of columns.

Furthermore, the shown embodiment includes four redundancy decoders 1, 2, 3 and. 4 each receiving internal address signals $XADD_1$ to $XADD_9$ for determining whether or not a redundancy word line should be selected, an X decoder 6 receiving the signals $XADD_1$ to $XADD_9$, another internal address signal $XADD_0$ and redundancy selection signals $XRDS_1$, $XRDS_2$, $XRDS_3$ and $XRDS_4$ respectively outputted from the redundancy decoders 1, 2, 3 and 4, for the purpose of determining which of words lines should be selected.

The shown embodiment also includes a roll call decoder 5 receiving the redundancy selection signals $XRDS_1$, $XRDS_2$, $XRDS_3$ and $XRDS_4$ of the redundancy decoders 1, 2, 3 and 4, the signal $XADD_0$, an internal address signal $YADD_0$, a one-shot precharge signal YRD generated by an ATD generation circuit 9, and a signal RCLB. The internal address signal $YADD_0$ is brought to the logical high level when "1" is given as a Y address and to the logical low level when "0" is given as a Y address. The one-shot precharge signal YRD generated by the ATD generation circuit 9 is used for precharging a dynamic circuit (not shown in FIG. 3) incorporated in the roll call decoder 5. At the time of a roll call testing, the roll call decoder 5 generates an output RCSB on the basis of the result of the roll call testing.

The sense amplifier data reading circuit 8 includes a data amplifier 10 having a pair of complementary inputs connected to a pair of complementary data output lines READT and READN of the sense amplifier 20, respectively. A pair of complementary data outputs of the data amplifier 10 are connected to a gate of two source-grounded N-channel transistors $Tr_6$ and $Tr_8$, respectively. A transfer gate N-channel transistor $Tr_5$ is connected between the line RWBSN and a drain of the transistor $Tr_6$, and an another transfer gate N-channel transistor $Tr_7$ is connected between the line RWBST and a drain of the transistor $Tr_8$.

The sense amplifier data reading circuit 8 also includes an NAND gate $NAND_2$ receiving the signal YRD and the signal RCLB, and a NOR gate $NOR_1$ receiving an output DEDB of the NAND gate $NAND_2$ and a signal BSLB and having an output connected to a gate of each of the transfer gate transistors $Tr_5$ and $Tr_7$.

The roll call result reading circuit 7 includes an N-channel transistor $Tr_4$ having a drain connected to a high voltage supply voltage and a gate connected to an output RCSB of the roll call decoder 5, an inverter $INV_3$ receiving the output RCSB of the roll call decoder 5, a source-grounded N-channel transistor $Tr_2$ having a gate connected to an output of the inverter $INV_3$, a transfer gate N-channel transistor $Tr_1$ connected between the line RWBSN and a drain of the transistor $Tr_2$, and an another transfer gate N-channel transistor $Tr_3$ connected between the line RWBST and a source of the transistor $Tr_4$.

The roll call result reading circuit 7 further includes an inverter $INV_1$ receiving the signal RCLB, a NAND gate $NAND_1$ receiving an output of the inverter $INV_1$ and the signal YRD, and another inverter $INV_2$ having an input connected to an output of the NAND gate $NAND_1$ and also having an output DEDR connected to a gate of each of the transfer gate N-channel transistor $Tr_1$ and $Tr_3$.

The pair of complementary lines RWBST and RWBSN are clamped to the high voltage supply voltage by means of a clamp circuit 13 formed of a pair of a gate-grounded P-channel transistors $Tr_9$ and $Tr_{10}$ connected between the high voltage supply voltage and the pair of complementary lines RWBST and RWBSN, respectively.

Now, operation will be described. First, the following is an operation for reading the memory cell data.

Since the input signal RCLB is at the logical high level, the signal DEDB is brought to the logical low level during a high level period of the one-shot precharge signal YRD. Accordingly, when the input signal BSLB is at the logical low level, the transfer gate N-channel transistors $Tr_5$ and $Tr_7$ are turned ON, so that a voltage difference is created between the lines RWBST and RWBSN, as the result of an amplification function of the data amplifier 10 which amplifies the memory cell data from the sense amplifier 20. At this time, since the signal DEDR is at the logical low level, the transfer gate N-channel transistors $Tr_1$ and $Tr_3$ are OFF, and therefore, no data is transferred from the roll call result reading circuit 7 to the lines RWBST and RWBSN.

The following is an operation in the roll call testing.

Since the input signal. RCLB is at the logical high level at the time of the roll call testing, the signal DEDR is brought to the logical high level during a period in which the one-shot precharge signal YRD is at a logical high level, so that the transfer gate N-channel transistors $Tr_1$ and $Tr_3$ are turned ON. Accordingly, a voltage difference is created between the lines RWBST and RWBSN in accordance with the condition of the output RCSB of the roll call decoder 5. On the other hand, since the transfer gate N-channel transistors $Tr_5$ and $Tr_7$ are OFF, the lines RWBST and RWBSN are isolated from the data amplifier 10.

Therefore, even if the semiconductor memory is a defective product having a defect in the memory cell or the sense amplifier, it is possible to carry out the roll call testing.

Figure 4:
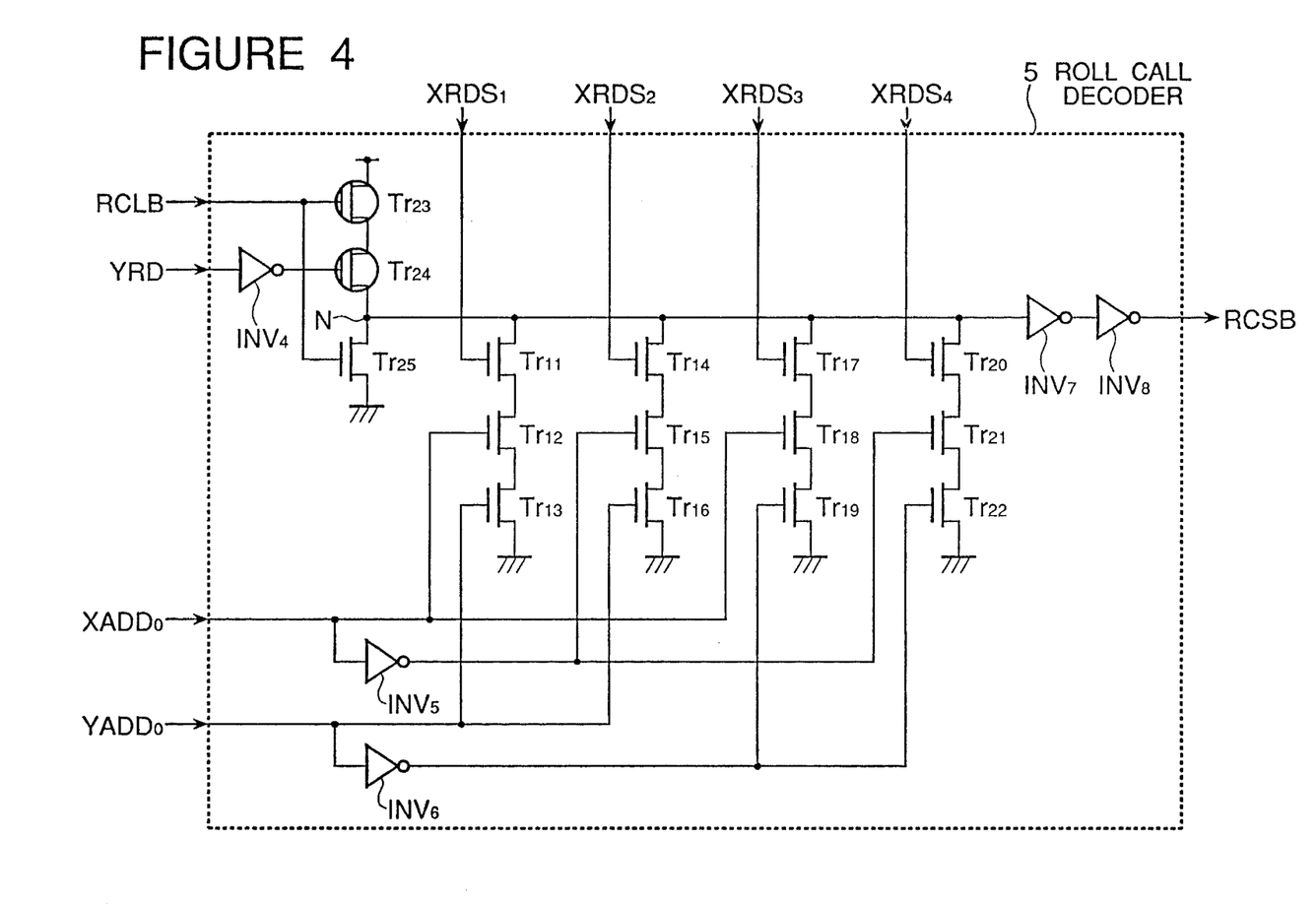
FIG. 4 is a circuit diagram of one example of the roll;call decoder included in the roll call circuit shown in FIG. 3.

Referring to FIG. 4, there is shown a circuit diagram of one example of the roll call decoder 5 included in the roll call circuit shown in FIG. 3.

The roll call decoder 5 includes an inverter $INV_4$ receiving the one-shot precharge signal YRD, a P-channel transistor $Tr_{24}$ having a gate connected to an output of the inverter $INV_4$, and another P-channel transistor $Tr_{23}$ having a gate connected to receive the input signal RCLB. These transistors $Tr_{23}$ and $Tr_{24}$ are connected in series between the high voltage supply voltage and a precharge node "N". The input signal RCLB is also applied to a gate of an N-channel transistor $Tr_{25}$, which is connected between the precharge node "N" and ground.

Furthermore, between the precharge node "N" and ground, there are connected four series circuits, each of which is composed of three series-connected N-channel transistors $Tr_{11}$, $Tr_{12}$ and $Tr_{13}$, $Tr_{14}$, $Tr_{15}$ and $Tr_{16}$, $Tr_{17}$, $Tr_{18}$ and $Tr_{19}$, or $Tr_{20}$, $Tr_{21}$ and $Tr_{22}$. A gate of the transistors $Tr_{11}$, $Tr_{14}$, $Tr_{17}$ and $Tr_{20}$ are connected to receive the signals $XRDS_1$, $XRDS_2$, $XRDS_3$ and $XRDS_4$, respectively. A gate of the transistors $Tr_{12}$ and $Tr_{18}$ are connected to receive the signal $XADD_0$, and a gate of the transistors $Tr_{15}$ and $Tr_{21}$ are connected to an output of an inverter $INV_5$ having an input receiving the signal $XADD_0$. A gate of the transistors $Tr_{13}$ and $Tr_{16}$ are connected to receive the signal $YADD_0$, and a gate of the transistors $Tr_{19}$ and $Tr_{22}$ are connected to an output of an inverter $INV_6$ having an input receiving the signal $YADD_0$. The precharge node "N" is corrected to an input of an inverter $INV_7$, which has an output connected to an input of an inverter $INV_8$, which generates the signal RCSB at its output.

Now, operation of the roll call decoder 5 will be described.

At the time of the roll call testing, since the input RCLB is the logical low level, the precharge node "N" is precharged to the high voltage supply voltage level during the logical high level period of the one-shot precharge signal YRD. At this time, if all of the three transistors ($Tr_{11}$, $Tr_{12}$ and $Tr_{13}$, $Tr_{14}$, $Tr_{15}$ and $Tr_{16}$, $Tr_{17}$, $Tr_{18}$ and $Tr_{19}$, or $Tr_{20}$, $Tr_{21}$ and $Tr_{22}$) of one of the four series circuits are turned on, a level on the precharge node "N" is determined by a resistance division ratio of the transistors $Tr_{23}$, $Tr_{24}$ and the three series-connected transistors all of which are in an ON condition. Therefore, the inverter $INV_7$ is set or configured to have such a threshold that the inverter $INV_8$ outputs a logical high level as the output RSCB at this time.

In this embodiment, the four redundancy selection signals $XRDS_1$, $XRDS_2$, $XRDS_3$ and $XRDS_4$ are supplied to the roll call decoder 5. Each of these redundancy selection signals $XRDS_1$, $XRDS_2$, $XRDS_3$ and $XRDS_4$ selects a redundant word line independent of each other. If the redundant word line is used, a corresponding redundancy selection signal $XRDS_1$, $XRDS_2$, $XRDS_3$ or $XRDS_4$ is at the logical high level. Otherwise, the redundancy selection signal $XRDS_1$, $XRDS_2$, $XRDS_3$ or $XRDS_4$ is at the logical low level.

For example, in order to know whether the redundancy selection signal $XRDS_1$ is at the logical high level or at the logical low level, it is sufficient if it is set to $XADD_0=$"1" and $YADD_0=$"1". Similarly, the level of the redundancy selection signals $XRDS_2$, $XRDS_3$ and $XRDS_4$ can be known by controlling $XADD_0$ and $YADD_0$.

Here, whether the redundancy selection signals $XRDS_1$, $XRDS_2$, $XRDS_3$ and $XRDS_4$ are at the logical high level or at the logical low level, is determined by a combination of $XADD_1$ to $XADD_9$. In other words, the use or non-use of the redundant word lines is determined independently of $XADD_0$ and the Y address. Accordingly, in order to know which of $XRDS_1$, $XRDS_2$, $XRDS_3$ and $XRDS_4$ is at the logical high level and which of $XRDS_1$, $XRDS_2$, $XRDS_3$ and $XRDS_4$ is at the logical low level, it is sufficient if the level of $XADD_0$ and $YADD_0$ are changed, with no necessity of dividing the input/output pad I/O.

At a time other than the roll call testing the input RCLB is at the logical high level, and therefore, the transistor $Tr_{25}$ is ON so that the precharge node "N" is fixed to a ground level.

Figure 5:
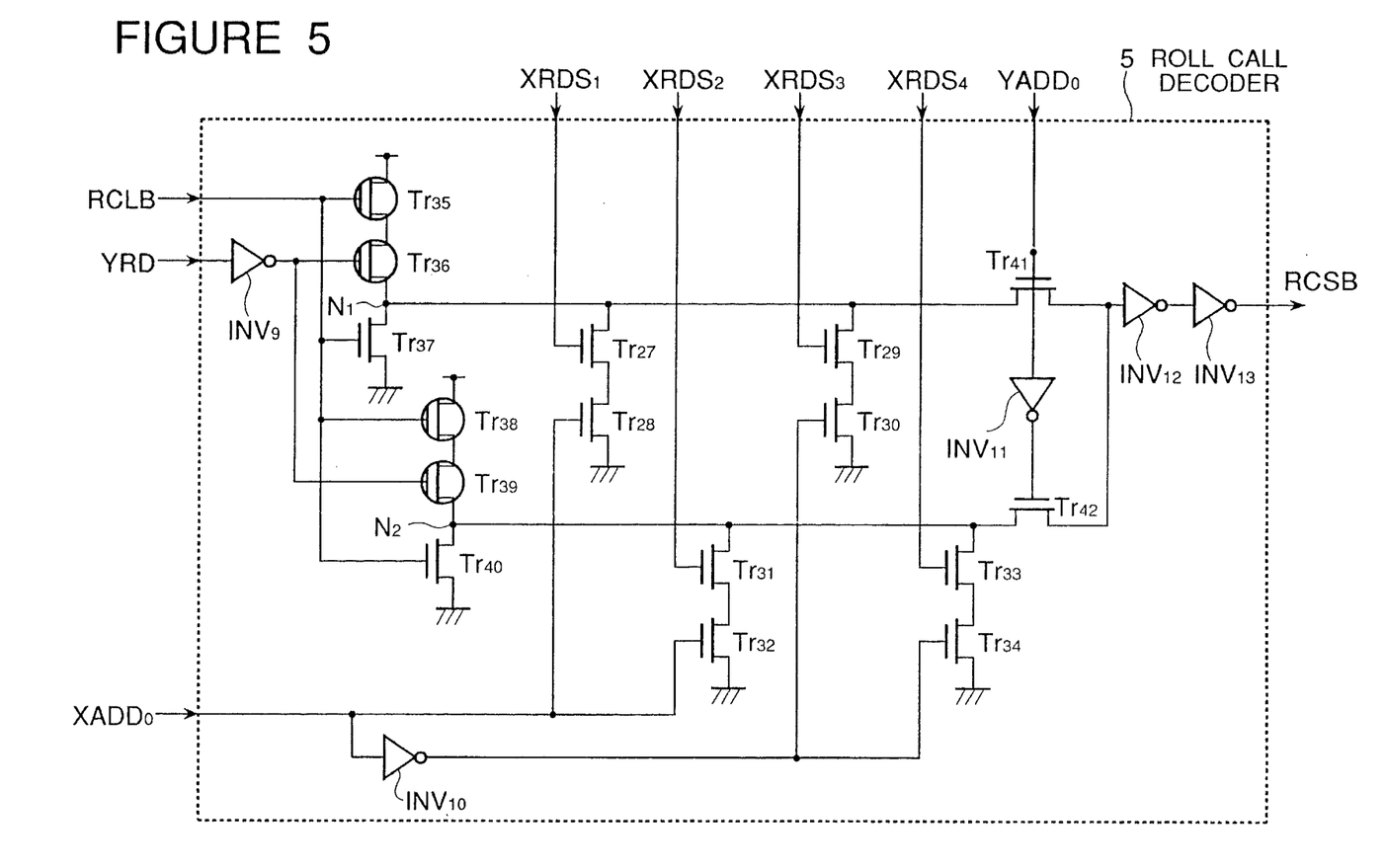
FIG. 5 is a circuit diagram of another example of the roll call decoder included in the roll call circuit shown in FIG. 3.

Referring to FIG. 5, there is shown a circuit diagram of another example of the roll call decoder 5 included in the roll call circuit shown in FIG. 3.

The second embodiment of the roll call decoder 5 includes an inverter $INV_9$ receiving the one-shot precharge signal YRD, a P-channel transistor $Tr_{36}$ having a gate connected to an output of the inverter $INV_9$, and another P-channel transistor $Tr_{35}$ having a gate connected to receive the input signal RCLB. These transistors $Tr_{35}$ and $Tr_{36}$ are connected in series between the high voltage supply voltage and a first precharge node "$N_1$". The input signal RCLB is also applied to a gate of an N-channel transistor $Tr_{37}$, which is connected between the first precharge node "$N_1$" and ground.

The second embodiment of the roll call decoder 5 also includes a P-channel transistor $Tr_{39}$ having a gate connected to an output of the inverter $INV_9$, and another P-channel transistor $Tr_{38}$ having a gate connected to receive the input signal RCLB. These transistors $Tr_{38}$ and $Tr_{39}$ are connected in series between the high voltage supply voltage and a second precharge node "$N_2$". The input signal RCLB is also applied to a gate of an N-channel transistor $Tr_{40}$, which is connected between the second precharge node "$N_2$" and ground.

Furthermore, between the first precharge node "$N_1$" and ground, there are connected two series circuits, each of which is composed of two series-connected N-channel transistors $Tr_{27}$ and $Tr_{28}$ or $Tr_{29}$ and $Tr_{30}$. In addition, between the second precharge node "$N_2$" and ground, there are connected two series circuits, each of which is composed of two series-connected N-channel transistors $Tr_{31}$ and $Tr_{32}$ or $Tr_{33}$ and $Tr_{34}$.

A gate of the transistors $Tr_{27}$, $Tr_{31}$, $Tr_{29}$ and $Tr_{33}$ are connected to receive the signals $XRDS_1$, $XRDS_2$, $XRDS_3$ and $XRDS_4$ respectively. A gate of the transistors $Tr_{28}$ and $Tr_{32}$ are connected to receive the signal $XADD_0$, and a gate of the transistors $Tr_{30}$ and $Tr_{34}$ are connected to an output of an inverter $INV_{10}$ having an input receiving the signal $XADD_0$.

In addition, the first precharge node "$N_1$" is connected through a transfer gate N-channel transistor $Tr_{41}$ to an input of an inverter $INV_{12}$, and the second precharge node "$N_2$" is connected through a transfer gate N-channel transistor $Tr_{42}$ to the input of the inverter $INV_{12}$. An output of the inverter $INV_{12}$ is connected to an input of another inverter $INV_{13}$, which outputs the signal RCSB. A gate of the transistor $Tr_{41}$ is connected to receive the signal $YADD_0$, and a gate of the transistor $Tr_{42}$ is connected to an output of an inverter $INV_{11}$ having an input receiving the signal $YADD_0$.

In this second embodiment, after the first and second precharge nodes "$N_1$" and "$N_2$" are simultaneously precharged, the level of the first and second precharge nodes "$N_1$" and "$N_2$" are determined in accordance with the redundancy selection signals $XRDS_1$, $XRDS_2$, $XRDS_3$ and $XRDS_4$ and $XADD_0$, and one of the first and second precharge nodes "$N_1$" and "$N_2$" is supplied to the inverter $INV_{12}$ through the transfer gates controlled by $YADD_0$.

In this embodiment, therefore, the level of the first and second precharge nodes "$N_1$" and "$N_2$" is determined by the resistance division ratio of the four transistors. Namely, since the number of the series-connected transistors is reduced, the ON resistance of the transistors becomes small.

In the above mentioned embodiments, $XADD_0$ and $YADD_0$ are used for selecting the redundancy selection signals $XRDS_1$, $XRDS_2$, $XRDS_3$ and $XRDS_4$. However, it would be apparent to persons in the art to possible to use any address bits which are not supplied to the redundancy decoders.

The above mentioned embodiments are applied to the roll call for the redundant word lines, but it would be apparent that the present invention can be applied to a roll call for redundancy column lines.

As will be apparent from the above, since the roll call circuit in accordance with the present invention is constructed to output the roll call result without reading out the memory cell information, it is possible to carry out the roll call testing even if the semiconductor memory is a defective product having a defect in a memory cell.

Furthermore, since the roll call circuit in accordance with the present invention is so constructed that a plurality of redundancy selection signals are supplied to one roll call decoder and decoded or selected by utilizing address bits which are influenced-by the selection and non-selection of the redundant word or column lines, it is possible test use or non-use of the plurality of redundant word or column lines by use of the one roll call decoder. Therefore, it is possible to reduce the required circuit area and the required number of external pads.

The invention has thus been shown and described with reference to the specific embodiments. However, it should be noted that the present invention is in no way limited to the details of the illustrated structures but changes and modifications may be made within the scope of the appended claims.

I claim:

1. A roll call circuit for a semiconductor memory having a plurality of memory cells including a plurality of redundant memory lines, the roll call circuit comprising:

a first circuit coupled to an output pad during a condition other than a roll call test, for transferring a memory cell information to said output pad, said first circuit being separated from said output pad at the time of the roll call test so that said memory cell information is not transferred to said output pad; and a second circuit coupled to said output pad at the time of the roll call test, for transferring a result of the roll call test to said output pad, wherein said second circuit is controlled by a roll call decoder, which includes a precharge node precharged to a first potential at the time of the roll call test, a first group of transistors connected in series between said precharge node and a second potential, one transistor of said first group of transistors having a gate connected to a first redundancy selection signal activated when a corresponding first redundant memory line is used, another transistor of said first group of transistors having a gate connected to a first internal address signal selectively activated and deactivated in accordance with a first external address signal, and a second group of transistors connected in series between said precharge node and said second potential, one transistor of said second group of transistors having a gate connected to a second redundancy selection signal activated when a corresponding second redundant memory line is used, another transistor of said second group of transistors having a gate connected to a second internal address signal selectively activated and deactivated in accordance with a second external address signal, said precharge node being connected through a buffer circuit to said second circuit.

2. A roll call circuit as claimed in claim 1 wherein said first and second internal address signals are selectively activated and deactivated by address signals other than address signals that change when any one of said plurality of redundant memory lines is selected.

3. A roll call decoder incorporated in a semiconductor memory having a plurality of memory cells including a plurality of redundant memory lines, the roll call decoder comprising:

a precharge node precharged to a first potential at the time of a roll call test;

a first group of transistors connected in series between said precharge node and a second potential, one transistor of said first group of transistors having a gate connected to a first redundancy selection signal activated when a corresponding first redundant memory line is used, another transistor of said first group of transistors having a gate connected to a first internal address signal selectively activated and deactivated in accordance with a first external address signal; and a second group of transistors connected in series between said precharge node and said second potential, one transistor of said second group of transistors having a gate connected to a second redundancy selection signal activated when a corresponding second redundant memory line is used, another transistor of said second group of transistors having a gate connected to a second internal address signal selectively activated and deactivated in accordance with a second external address signal.

4. A roll call decoder as claimed in claim 3 wherein said first and second internal address signals are selectively activated and deactivated by address signals other than address signals that change when any one of said plurality of redundant memory lines is selected.

5. A semiconductor memory comprising:

a plurality of memory cells including at least one redundant memory cell;

selecting means coupled to said plurality of memory cells, for selecting one memory cell in accordance with an address signal supplied externally;

reading means coupled to said plurality of memory cells, for reading data from said one memory cell selected by said selecting means;

a transfer gate connected between said reading means and an output terminal;

a roll call decoder receiving said address signal for generating a detection signal indicative of whether or not said address signal corresponds to said at least one redundant memory cell;

a first means for rendering said transfer gate conductive in an ordinary operation condition so that said data read by said reading means is transferred through said transfer gate to said output terminal; and a second means for rendering said transfer gate non-conductive during a roll call test independently of said detection signal, said second means also operating to simultaneously supply to said output terminal a potential in accordance with said detection signal.

6. A semiconductor memory claimed in claim 5, wherein, when said detection signal indicates that said address signal corresponds to said at least one redundant memory cell, said second means outputs a first logical level to said output terminal, and when said detection signal indicates that said address signal does not correspond to said at least one redundant memory cell, said second means outputs a second logical level to said output terminal, said second logical level being different from said first logical level.

* * * * *